United States Patent
Kishimoto et al.

(10) Patent No.: US 11,870,212 B2
(45) Date of Patent: Jan. 9, 2024

(54) SEMICONDUCTOR LASER DEVICE AND METHOD FOR MANUFACTURING THE SAME

(71) Applicant: Mitsubishi Electric Corporation, Tokyo (JP)

(72) Inventors: Kazumasa Kishimoto, Tokyo (JP); Naoki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 419 days.

(21) Appl. No.: 16/963,054

(22) PCT Filed: Mar. 28, 2018

(86) PCT No.: PCT/JP2018/012627
§ 371 (c)(1),
(2) Date: Jul. 17, 2020

(87) PCT Pub. No.: WO2019/186743
PCT Pub. Date: Oct. 3, 2019

(65) Prior Publication Data
US 2020/0350741 A1    Nov. 5, 2020

(51) Int. Cl.
| | | |
|---|---|---|
| H01S 5/02 | (2006.01) | |
| H01S 5/042 | (2006.01) | |
| H01S 5/12 | (2021.01) | |
| H01S 5/227 | (2006.01) | |
| H01S 5/22 | (2006.01) | |
| H01S 5/028 | (2006.01) | |

(52) U.S. Cl.
CPC ........ H01S 5/0208 (2013.01); H01S 5/04256 (2019.08); H01S 5/04257 (2019.08);
(Continued)

(58) Field of Classification Search
CPC ................. H01S 5/2275; H01S 5/2277; H01S 5/12–125; H01S 5/16–168;
(Continued)

(56) References Cited

U.S. PATENT DOCUMENTS

| | | | |
|---|---|---|---|
| 8,787,419 B2* | 7/2014 | Behfar | ................... H01S 5/028 257/632 |
| 2003/0064536 A1* | 4/2003 | Yamada | .............. H01S 5/04254 438/31 |

(Continued)

FOREIGN PATENT DOCUMENTS

| | | |
|---|---|---|
| JP | H07135369 A | 5/1995 |
| JP | 2004288876 A | 10/2004 |

(Continued)

OTHER PUBLICATIONS

International Search Report; Written Opinion; and Notification of Transmittal of the International Search Report and the Written Opinion of the International Searching Authority, or the Declaration issued in PCT/JP2018/012627; dated Jun. 19, 2018.

*Primary Examiner* — Sean P Hagan
(74) *Attorney, Agent, or Firm* — Studebaker & Brackett PC

(57) ABSTRACT

A mesa (34) includes a resonator and a second conductivity type contact layer (24). Grooves (32) are provided on both sides of the mesa (34). The first conductivity type contact layer (12) and a side face of the mesa (34) including an end face of the resonator construct an L shape (50). The first conductivity type contact layer (12) constructs bottom surfaces of the L shape (50) and the grooves (32). A side face of the groove (32) includes a slope (38) near the bottom surface (46) and a side face (42) above. A side face of the L shape (50) includes a slope (40) near the bottom surface (48) and a side face (44) above. A first electrode (28) is connected to the first conductivity type contact layer (12) at the bottom surface (46) of the groove (32). A second electrode (30) is connected to the second conductivity type contact layer (24) above the mesa (34).

13 Claims, 19 Drawing Sheets

(52) U.S. Cl.
CPC .............. *H01S 5/12* (2013.01); *H01S 5/2275* (2013.01); *H01S 5/0283* (2013.01); *H01S 5/2224* (2013.01)

(58) Field of Classification Search
CPC ................... H01S 5/0283; H01S 5/423; H01S 5/04256–04257; H01S 5/4031; H01S 5/4087; H01S 5/4093
See application file for complete search history.

(56) References Cited

U.S. PATENT DOCUMENTS

| | | | | |
|---|---|---|---|---|
| 2007/0030869 | A1* | 2/2007 | Horie | H01S 5/4031 372/45.012 |
| 2010/0189154 | A1* | 7/2010 | Makino | G02B 6/12007 257/458 |
| 2015/0043604 | A1* | 2/2015 | Satoh | H01S 5/22 372/45.01 |
| 2016/0329684 | A1* | 11/2016 | Sakuma | H01S 5/2275 |
| 2017/0207604 | A1* | 7/2017 | Watanabe | H01S 5/2272 |

FOREIGN PATENT DOCUMENTS

| | | | | |
|---|---|---|---|---|
| JP | 2012209489 A | | 10/2012 | |
| WO | WO-2004102753 A1 | * | 11/2004 | ........... H01S 5/0265 |

\* cited by examiner

SEMICONDUCTOR LASER DEVICE AND METHOD FOR MANUFACTURING THE SAME

FIELD

The present disclosure relates to a surface mounting type semiconductor laser device that forms a resonator end face by dry etching and a method for manufacturing the same.

BACKGROUND

Quantities of data exchanged over optical communication networks are continuously growing, and so there is a continuous demand that semiconductor laser devices used in optical communication networks achieve higher operating speeds.

Some semiconductor laser devices use a plurality of DFB (Distributed Feedback) lasers which are integrated to enhance their operating speeds. One such example is four 25 Gbps DFB lasers having different wavelengths integrated together, laser beams emitted from the DFB lasers being internally multiplexed to output a 100 Gbps optical signal.

In realizing such a multi-wavelength integrated semiconductor laser device, it is important to reduce electric capacity and improve position accuracy at resonator end faces. A reduction of electric capacity contributes to speed enhancement of electric signals for modulating semiconductor laser devices. Improvement of position accuracy at resonator end faces facilitates phase control of diffraction gratings at the resonator end faces, which leads to an improvement in SMSR (Side Mode Suppression Ratio) yield.

Application of a surface mounting type structure is effective in reducing electric capacity. Non-surface mounting type semiconductor laser devices include two electrodes on front and back sides of the element, which increases device capacitance. On the other hand, surface mounting type semiconductor laser devices form both of the two electrodes on the front side of the device, which reduces device capacitance. In addition, since flip chip mounting is enabled, it is possible to reduce parasitic capacitance caused by wiring.

It is effective to use dry etching to form an end face in order to improve position accuracy of the resonator end face. Using cleavage instead of dry etching to form an end face causes position accuracy to become poor due to mechanical variations. On the other hand, position accuracy in dry etching is determined by superimposition accuracy of photolithography and the values are on the submicron level, and so using dry etching to form an end face can improve position accuracy.

PTLs 1 and 2 describe surface mounting type semiconductor laser devices. Resonator end faces of the semiconductor laser devices described in these literatures are formed by cleavage.

PTL 3 describes a surface mounting type semiconductor laser device in which a resonator end face is formed by dry etching. The literature discloses a method for forming a resonator end face and exposing a contact layer to form a substrate-side electrode by single dry etching.

CITATION LIST

Patent Literature

[PTL 1] JP H7-135369 A
[PTL 2] JP 2012-209489 A
[PTL 3] JP 2004-288876 A

SUMMARY

Technical Problem

There is a problem in that when cleavage is used instead of dry etching to form a resonator end face as described in PTLs 1 and 2, end face position accuracy deteriorates due to a mechanical variation. When high level end face phase control is required for a DFB laser, particularly when a 4-wavelength integrated DFB laser used for 100 Gbps communication is manufactured, this constitutes a factor that significantly reduces the SMSR yield.

On the other hand, when an end face is formed by dry etching as described in PTL 3, the end face position accuracy is improved. In this end face forming step by dry etching, it is desirable, from the standpoint of process simplification, that the substrate-side contact layer also be exposed to provide a substrate-side electrode leading part, but in such a case, there is a production problem as shown below.

In addition to having a distribution within a wafer surface, a normal dry etching rate slows down near an etching side face caused by ion shadowing, producing a tailing phenomenon. Therefore, in order to reliably expose a substrate-side contact layer in a desired region over the entire wafer surface, it is necessary to perform over-etching in consideration of rate distribution and tailing. In this case, over-etching reduces a thickness of the substrate-side contact layer, causing an increase in device resistance, and so it is necessary to increase the thickness by assuming a decrease in layer thickness this time. However, increasing the thickness of the contact layer reduces a throughput of an epitaxial growth apparatus. Furthermore, in addition to the DFB laser, when, for example, a monitor PD is integrated on the same chip, it is desirable to suppress current leakage between both elements, and this requires the resistance of the substrate-side contact layer to be partially increased. Techniques such as thermal diffusion of impurity or ion implantation are assumed to increase the resistance, but when the contact layer is thick, time for thermal diffusion necessary for higher resistance or ion implantation energy will increase drastically, causing a further increase of production throughput.

The present disclosure has been implemented to solve the above-described problems, and it is an object of the present disclosure to obtain a semiconductor laser device and a method for manufacturing the same having small parasitic capacitance and device capacitance, high position accuracy at a resonator end face and capable of minimizing the contact layer thickness and thereby increasing the production throughput.

Solution to Problem

A semiconductor laser device according to the present disclosure includes: a substrate; and a semiconductor layer provided on the substrate and including a first conductivity type contact layer, wherein a mesa is provided in the semiconductor layer and includes a resonator and a second conductivity type contact layer, grooves are provided on both sides of the mesa, a top surface of the first conductivity type contact layer and a side face of the mesa including at least one end face of the resonator construct an L shape, the top surface of the first conductivity type contact layer constructs a bottom surface of the L shape, a side face of the groove includes a first slope near the bottom surface of the groove and a first side face above the first slope and substantially perpendicular, a side face of the L shape includes a second slope near the bottom surface of the L shape and a second side face above the second slope and substantially perpendicular, a first electrode is connected to the first conductivity type contact layer at the bottom surface of at least one of the grooves, and a second electrode is connected to the second conductivity type contact layer.

A method for manufacturing a semiconductor laser device according to the present disclosure, which includes a mesa having a resonator, includes: sequentially forming a first conductivity type contact layer, a first conductivity type cladding layer, an active layer, a second conductivity type cladding layer and a second conductivity type contact layer on a substrate; performing dry etching and leaving a part of the first conductivity type contact layer to form grooves on both sides of the mesa and an L shape including a side face of the mesa having an end face of the resonator; masking an etching side face formed by the dry etching, using an etchant having selectivity with respect to the first conductivity type contact layer, wet etching the first conductivity type cladding layer on bottom surfaces of the groove and the L shape to expose the first conductivity type contact layer; forming a first electrode connected to the first conductivity type contact layer at the bottom surface of at least one of the grooves, and forming a second electrode connected to the second conductivity type contact layer.

Advantageous Effects of Disclosure

The semiconductor laser device according to the present disclosure has small parasitic capacitance and device capacitance, high position accuracy at a resonator end face and can minimize the contact layer thickness.

By using the method according to the present disclosure, the semiconductor laser device having small parasitic capacitance and device capacitance, high position accuracy at a resonator end face and capable of minimizing the contact layer thickness can be manufactured. Thereby, the throughput of the epitaxial growth apparatus can be improved.

DESCRIPTION OF EMBODIMENTS

First Embodiment

A semiconductor laser device and a method for manufacturing the same according to a first embodiment will be described.

(Structure)

Figure 1A:
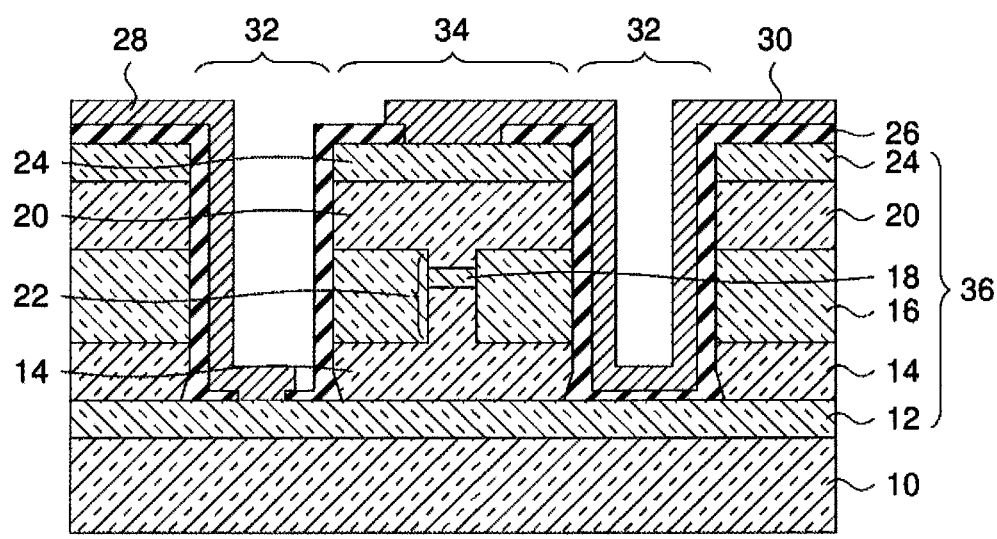
FIGS. 1A and 1B are cross-sectional views of the semiconductor laser device according to the first embodiment.
Figure 1B:
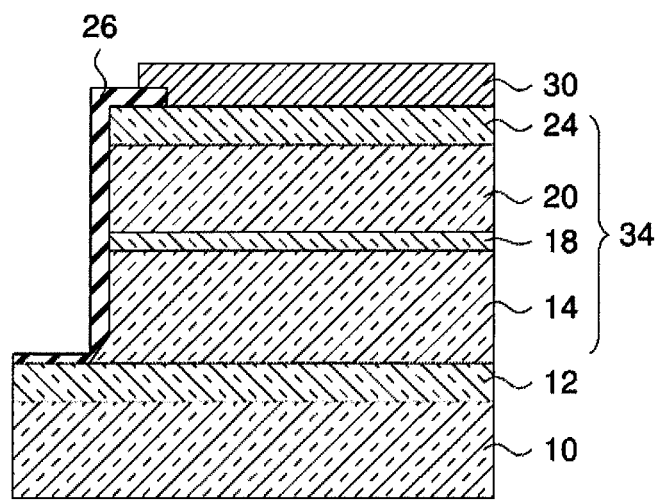
Figure 2:
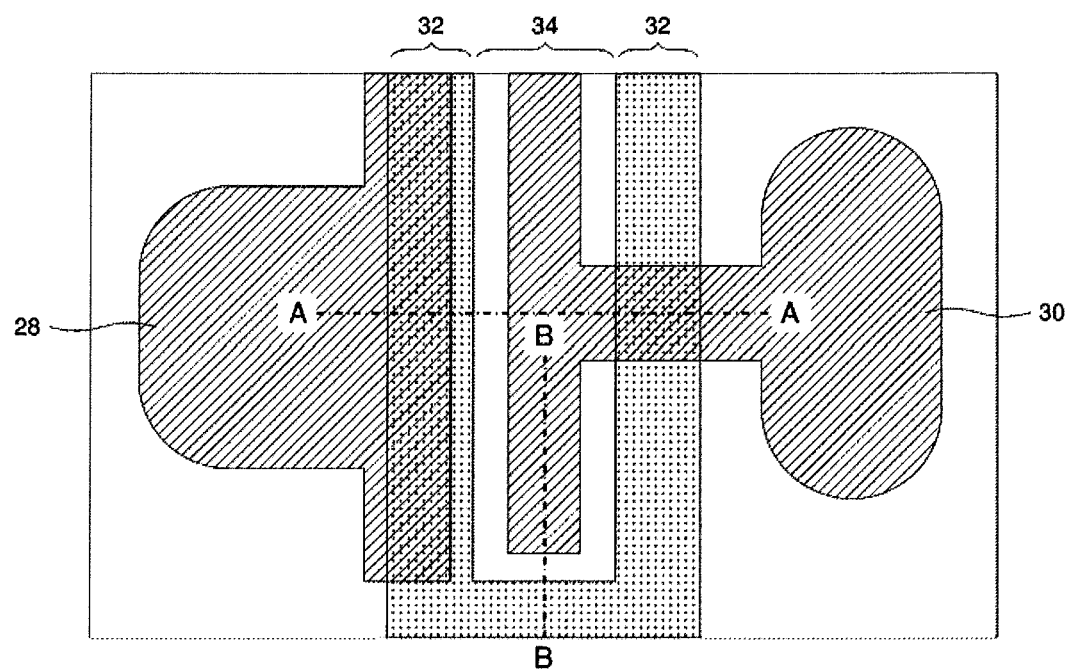
FIG. 2 is a top view of the semiconductor laser device according to the first embodiment.
Figure 3A:
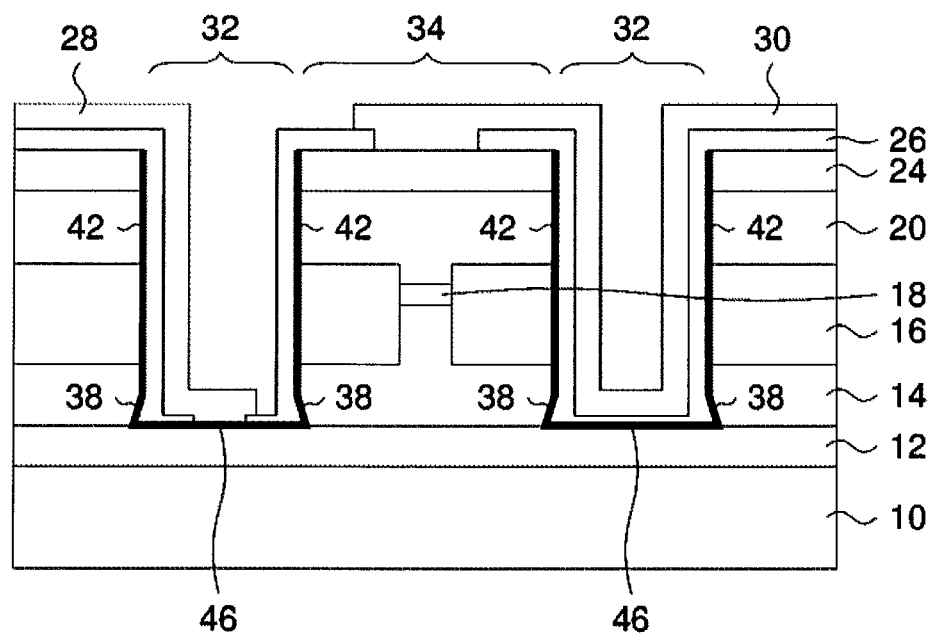
FIGS. 3A and 3B are cross-sectional views of the semiconductor laser device according to the first embodiment.
Figure 3B:
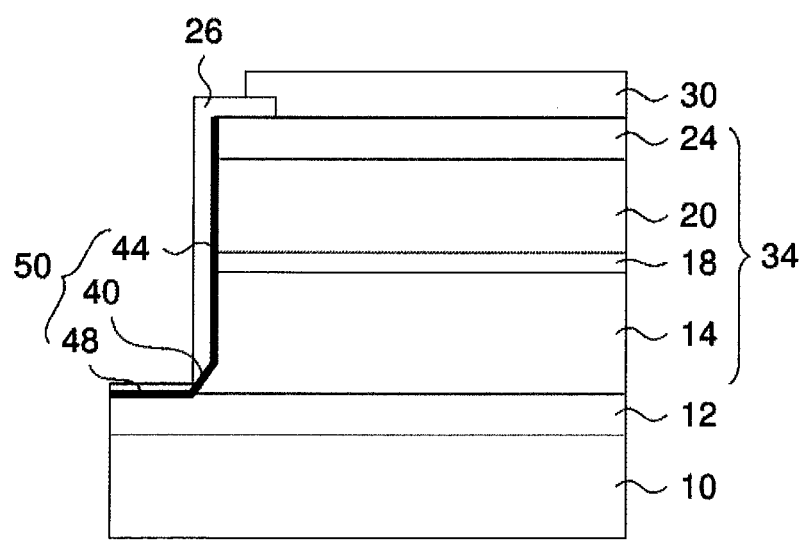

A structure of a semiconductor laser device according to a first embodiment will be described. FIGS. 1A and 1B are cross-sectional views of the semiconductor laser device according to the first embodiment. FIG. 2 is a top view. A-A and B-B in FIG. 2 are cutting lines indicating cross sections in FIGS. 1A and 1B. FIGS. 3A and 3B are diagrams similar to FIGS. 1A and 1B, but omit hatching and partially use thick lines for the sake of description.

An n-type contact layer 12 is formed on a substrate 10. An n-type cladding layer 14, an active layer 18 and a p-type cladding layer 20 are formed on the n-type contact layer 12. A ridge 22 is constructed of a part of the n-type cladding layer 14, the active layer 18 and a part of the p-type cladding layer 20. The ridge 22 functions as a laser waveguide. Block layers 16 are embedded on both sides of the ridge 22. A p-type contact layer 24 is formed on the p-type cladding layer 20. A plurality of layers from the n-type contact layer 12 to the p-type contact layer 24 are collectively called a semiconductor layer 36. Note that a diffraction grating structure in which a refractive index changes periodically may be formed in the n-type cladding layer 14 or the p-type cladding layer 20.

Materials of the above-described respective members will be described. The substrate 10 is made of semi-insulating InP. The n-type contact layer 12 is made of n-type InGaAs having a thickness of 1.0 µm. The n-type cladding layer 14 is made of n-type InP having a thickness of 3.0 µm. The active layer 18 includes a MQW (Multiple Quantum Well) structure made of i-type AlGaInAs and having a thickness of 0.2 µM. The p-type cladding layer 20 is made of p-type InP having a thickness of 2.0 µm. The block layer 16 is made of Fe—InP (Fe-doped InP), n-type InP and p-type InP laminated in that order. The p-type contact layer 24 is made of p-type InGaAs having a thickness of 0.3 µm. Note that the n-type contact layer 12 and the p-type contact layer 24 may be made of n-type InGaAsP and p-type InGaAsP respectively.

As shown in FIGS. 1A and 3A, grooves 32 are formed on both sides of the region including the ridge 22. A mesa 34 is constructed of the n-type cladding layer 14, the active layer 18, the p-type cladding layer 20, the p-type contact layer 24 and the block layer 16 sandwiched between the grooves 32. A current constriction structure of an embedded type semiconductor laser is constructed from the p-type cladding layer 20 to the n-type cladding layer 14 in the mesa 34.

As shown in FIG. 3A, a bottom surface 46 of the groove 32 is made up of a top surface of the n-type contact layer 12. A side face of the groove 32 is divided into a slope 38 near the bottom surface 46 and a side face 42 above. The slope 38 has an inclination in an inverse mesa direction with respect to a direction perpendicular to the substrate 10. The inverse mesa direction refers to a direction in which the n-type cladding layer 14 is intruded from above to below in the direction perpendicular to the substrate. On the other hand, the side face 42 is substantially perpendicular to the substrate 10.

Note that the top surface of the n-type contact layer 12 that constitutes the bottom surface 46 may have unevenness or the like after various producing steps.

In FIG. 3A, no n-type cladding layer 14 is present on the bottom surface 46, but it may be partially present. However, the n-type cladding layer 14 is only allowed to exist near the slope 38 in such a way as not to block electrical connection between the n-type electrode 28, which will be described later, and the n-type contact layer 12.

As shown in FIGS. 1B and 3B, the mesa 34 is cut away near the resonator end face. In this cut-away region, the top surface of the n-type contact layer 12 and the side face of the mesa 34 including the resonator end face construct an L shape 50.

As shown in FIG. 3B, the top surface of the n-type contact layer 12 constructs a bottom surface 48 of the L shape 50. The side face of the L shape 50 is divided into a slope 40 near the bottom surface 48 and a side face 44 above. The slope 40 has an inclination in a forward mesa direction with respect to a direction perpendicular to the substrate 10. The forward mesa direction refers to a direction in which the n-type cladding layer 14 extends from above to below in the direction perpendicular to the substrate. On the other hand, the side face 44 is substantially perpendicular to the substrate 10. A bottom end of the side face 44 extends to the vicinity of the top surface of the n-type contact layer 12 and functions as an end face of the resonator. Note that although the diagram illustrates the slope 40 lengthened for the sake of description, the slope 40 is preferably shorter and the bottom end of the side face 44 preferably extends to the vicinity of the top surface of the n-type contact layer 12.

Note that the top surface of the n-type contact layer 12 that constitutes the bottom surface 48 may have unevenness or the like after various producing steps.

No n-type cladding layer 14 is present on the bottom surface 48 in FIG. 3A, but it may be present.

As shown in FIGS. 1A, 1B, 3A, and 3B, an insulating film 26 is formed from the bottom surface of the groove 32, through the side face to the top of the p-type contact layer 24. The insulating film 26 is also formed from the bottom surface of the L shape 50 through the side face to the top of the p-type contact layer 24. The insulating film 26 has openings above the bottom surface 46 of the groove 32 and above the mesa 34.

An n-side electrode 28 connected to the n-type contact layer 12 through the opening of the insulating film 26 located on the bottom surface 46 of the left-side groove 32 of the left and right grooves 32 shown in FIGS. 1A and 3A is formed so as to pass along the side face of the groove 32 and led out to above the insulating film 26. Furthermore, a p-side electrode 30 connected to the p-type contact layer 24 through the opening of the insulating film 26 on the mesa 34 is formed. Note that the connection referred to here is an electrical connection. In this way, the semiconductor laser device according to the first embodiment is a surface mounting type semiconductor laser device in which both the n-side electrode 28 and the p-side electrode 30 are formed on the front side.

(Manufacturing Method)

A method for manufacturing a semiconductor laser device according to the first embodiment will be described. Hereinafter, description will be made with reference to FIGS. 4A to 14B. The drawings marked with A and B of these drawings denote cross-sectional views along A-A and B-B in FIG. 2 respectively.

Figure 4A:
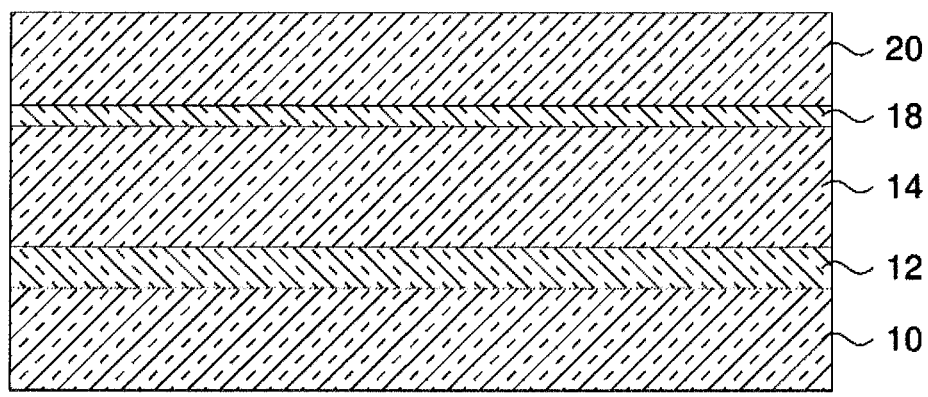
FIGS. 4A and 4B are cross-sectional views for explaining the method for manufacturing a semiconductor laser device according to the first embodiment.
Figure 4B:
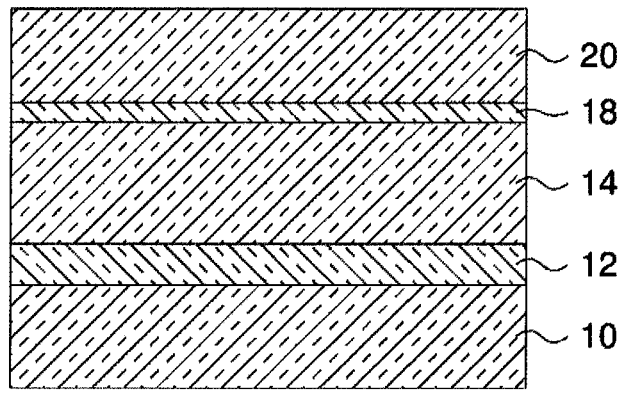

First, a (100) InP substrate is provided as the substrate 10, and as shown in FIGS. 4A and 4B, the n-type contact layer 12, the n-type cladding layer 14, the active layer 18 and the p-type cladding layer 20 are laminated on the substrate 10 using an MOCVD (Metal Organic Chemical Vapor Deposition) method.

Figure 5A:
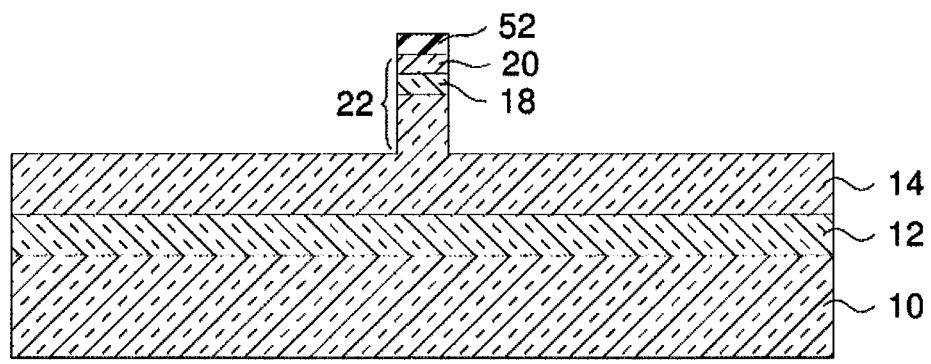
FIGS. 5A and 5B are cross-sectional views for explaining the method for manufacturing a semiconductor laser device according to the first embodiment.
Figure 5B:
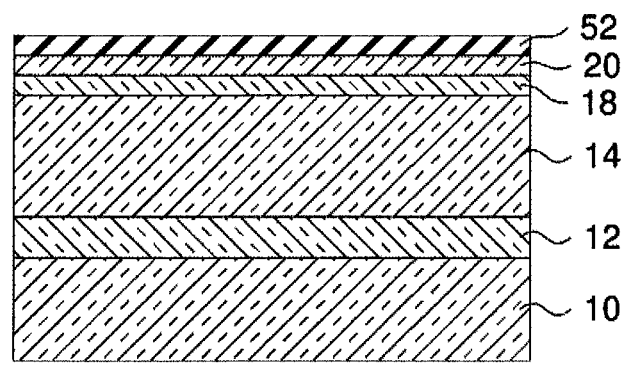

Next, as shown FIGS. 5A and 5B, the ridge 22 extending in a <011> direction is formed. For this purpose, a mask 52 having a ridge pattern is formed first. The mask 52 can be formed, by forming a SiO film (of any composition) having a thickness of 0.4 µm using, for example, a plasma CVD (Chemical Vapor Deposition) method, then forming a resist pattern on the SiO film using photolithography, transcribing the resist pattern to the SiO film using an RIE (Reactive Ion Etching) method and a $CF_4/O_2$ mixed gas and then removing the resist using $O_2$ plasma. Next, the ridge 22 is formed by etching parts of the p-type cladding layer 20, the active layer 18 and the n-type cladding layer 14 using, for example, the RIE method and a $SiCl_4/Ar$ mixed gas while using the mask 52 as an etching mask.

Figure 6A:
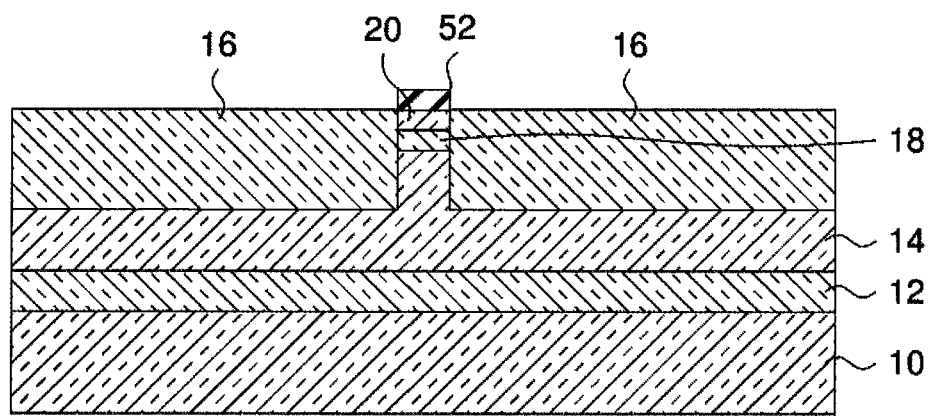
FIGS. 6A and 6B are cross-sectional views for explaining the method for manufacturing a semiconductor laser device according to the first embodiment.
Figure 6B:
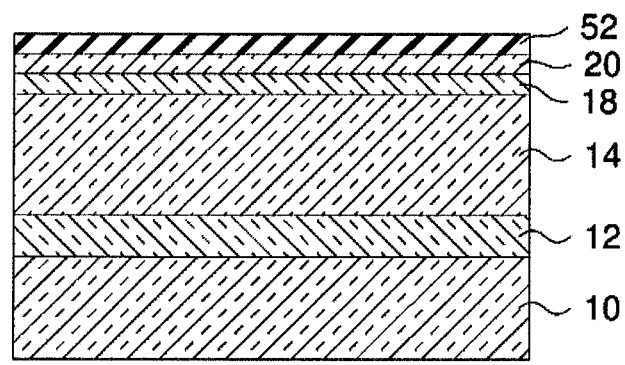

Next, as shown in FIGS. 6A and 6B, both sides of the ridge 22 are embedded with the block layer 16 using the mask 52 as a selective growth mask and the MOCVD method.

Figure 7A:
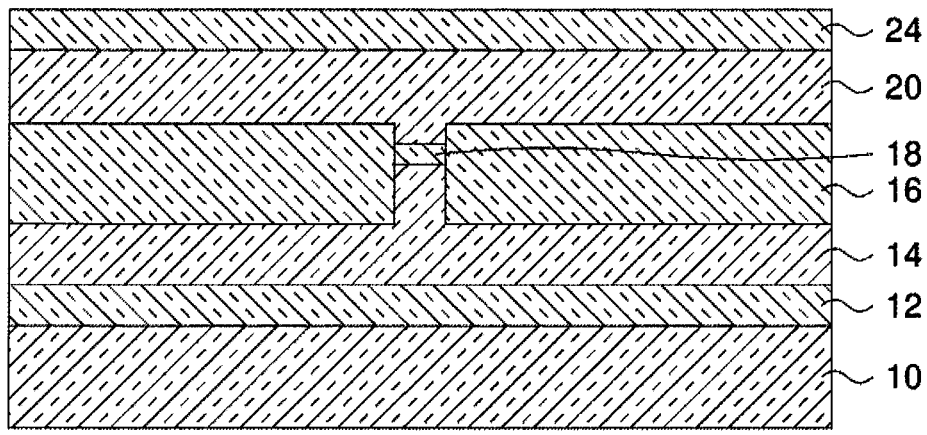
FIGS. 7A and 7B are cross-sectional views for explaining the method for manufacturing a semiconductor laser device according to the first embodiment.
Figure 7B:
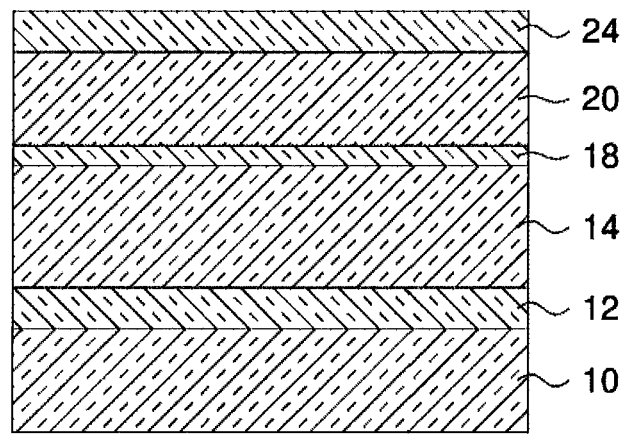

Next, as shown in FIGS. 7A and 7B, after the mask 52 is removed using hydrofluoric acid, and the p-type cladding layer 20 and the p-type contact layer 24 are laminated on the entire surface using the MOCVD method.

Figure 8A:
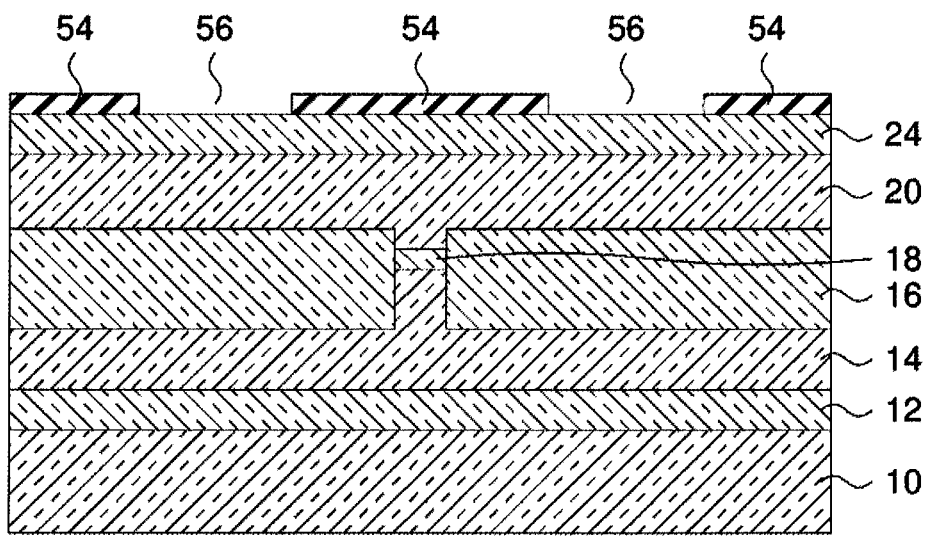
FIGS. 8A and 8B are cross-sectional views for explaining the method for manufacturing a semiconductor laser device according to the first embodiment.
Figure 8B:
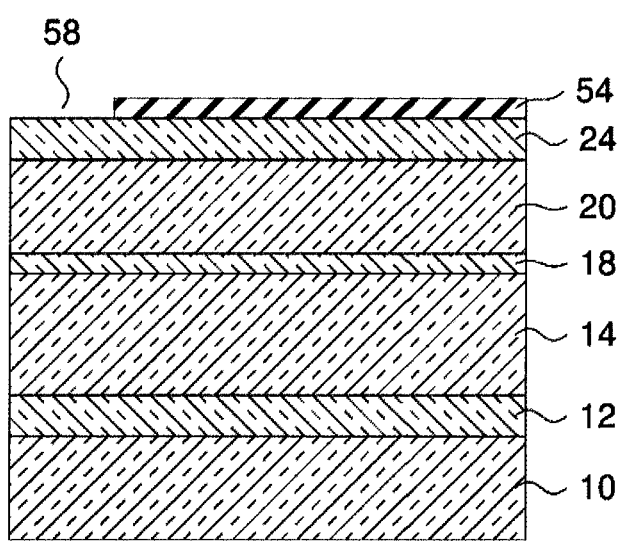

Next, as shown in FIGS. 8A and 8B, a mask 54 is formed. A method for forming the mask 54 is the same as the aforementioned mask 52. An opening 56 and an opening 58 are formed in the mask 54. Edges of the opening 56 are parallel to the ridge 22 (that is, parallel to <011> direction) and edges of the opening 58 are formed perpendicular to the ridge 22 (that is, parallel to <01-1> direction).

Figure 9A:
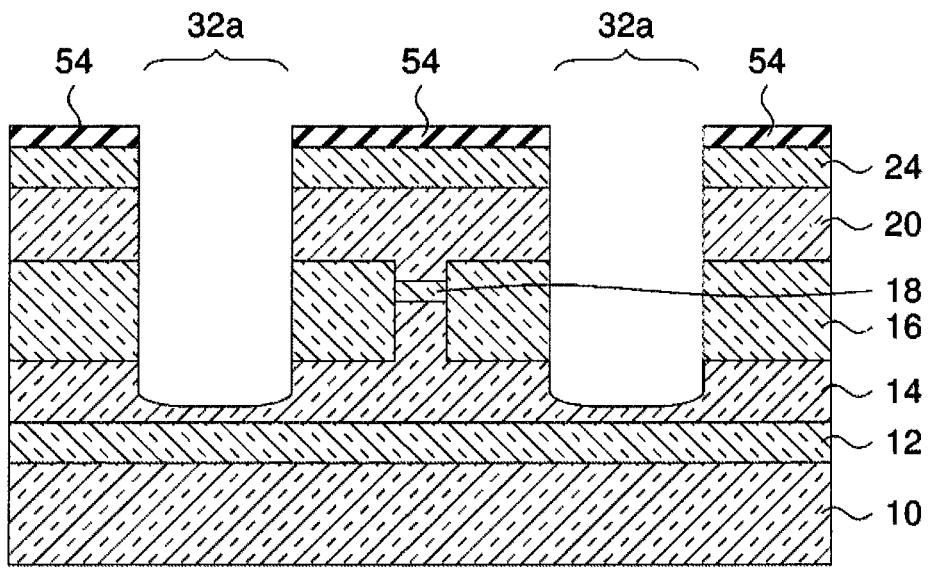
FIGS. 9A and 9B are cross-sectional views for explaining the method for manufacturing a semiconductor laser device according to the first embodiment.
Figure 9B:
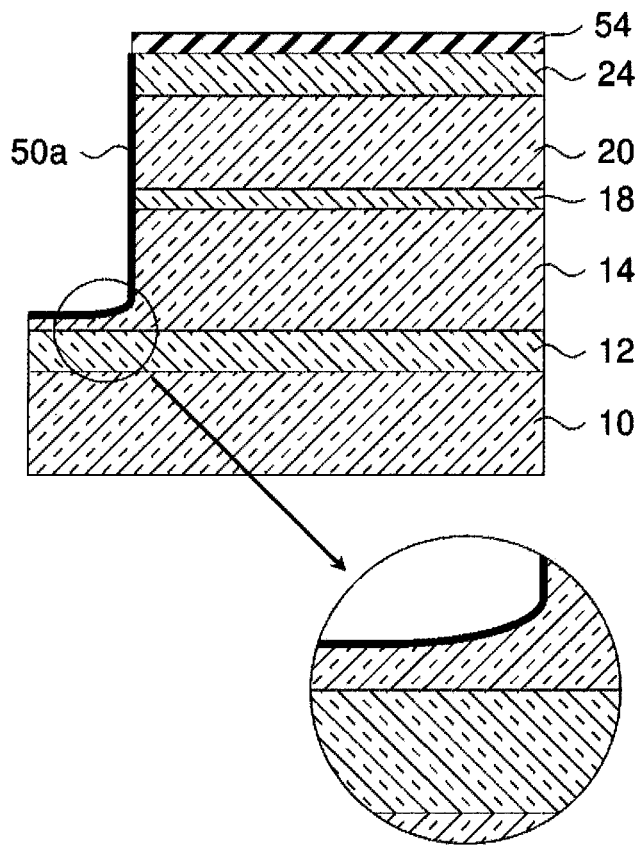

Next, as shown in FIGS. 9A and 9B, dry etching is performed using the mask 54 to form the groove 32a and the L shape 50a. The L shape 50a is constructed of the side faces of the p-type contact layer 24, the p-type cladding layer 20, the active layer 18, and the n-type cladding layer 14 and the top surface of the n-type cladding layer 14. Note that the L shape 50a is expressed using a thick line in FIG. 9B for the sake of description. The dry etching is performed in such a way that the side faces of the groove 32a and the L shape 50a are substantially perpendicular to the substrate 10. The side faces formed in this way are called etching side faces. An angle of inclination of the etching side face with respect to the plane perpendicular to the substrate 10 is preferably within 5° or further within 1°. It is preferable to perform the dry etching by an ICP (Inductive Coupled Plasma)-RIE method using a gas containing a halogen element, for example, $SiCl_4$/Ar mixed gas as an etching gas under a low pressure and a high bias. The dry etching is stopped before the deepest part of the bottom surface of the L shape 50a reaches the n-type contact layer 12. Note that when the dry etching is performed until the deepest part of the bottom surface of the L shape 50a reaches the n-type contact layer 12, electric resistance of the n-type contact layer 12 increases by the decrease in thickness, but if this is tolerable, the dry etching may be performed in such a way. Alternatively, only the front end face or the rear end face of the resonator may be formed by dry etching or both end faces may be formed.

When the dry etching is completed, an area where the side faces of the groove 32a and the L shape 50a cross the bottom surface has a tailing shape as shown in FIGS. 9A and 9B. FIG. 9B is an enlarged view of the vicinity of the bottom surface of the L shape 50a. This tailing phenomenon is attributable to the shadowing effect of ions whereby the etching rate decreases near the side face.

Figure 10A:
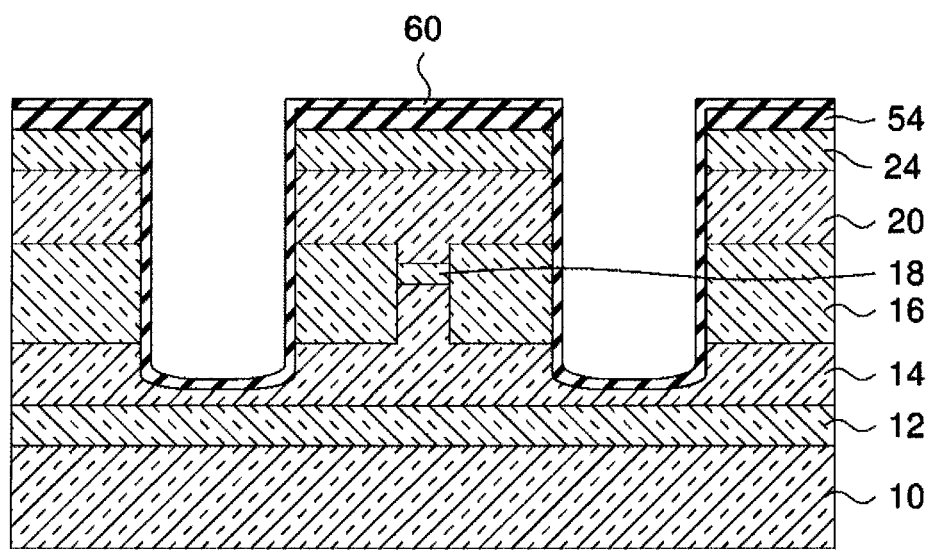
FIGS. 10A and 10B are cross-sectional views for explaining the method for manufacturing a semiconductor laser device according to the first embodiment.
Figure 10B:
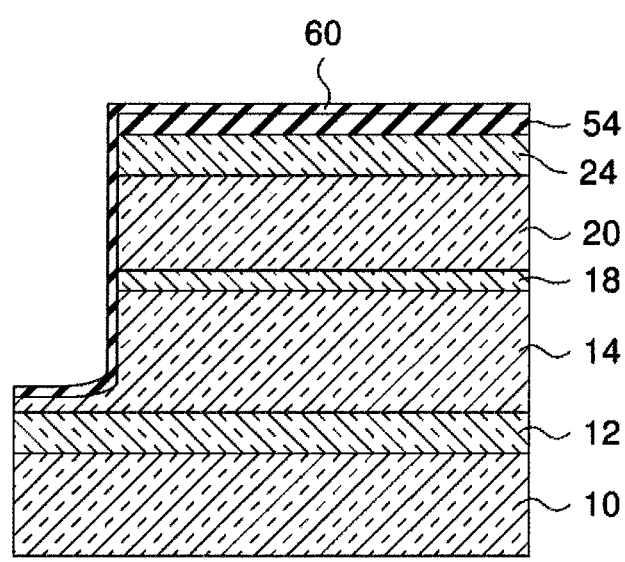

Next, as shown in FIGS. 10A and 10B, a mask 60 is formed on the entire surface including the side faces of the groove 32a and the L shape 50a. A SiO having a thickness of 0.2 μm formed using plasma CVD can be used as the mask 60.

Figure 11A:
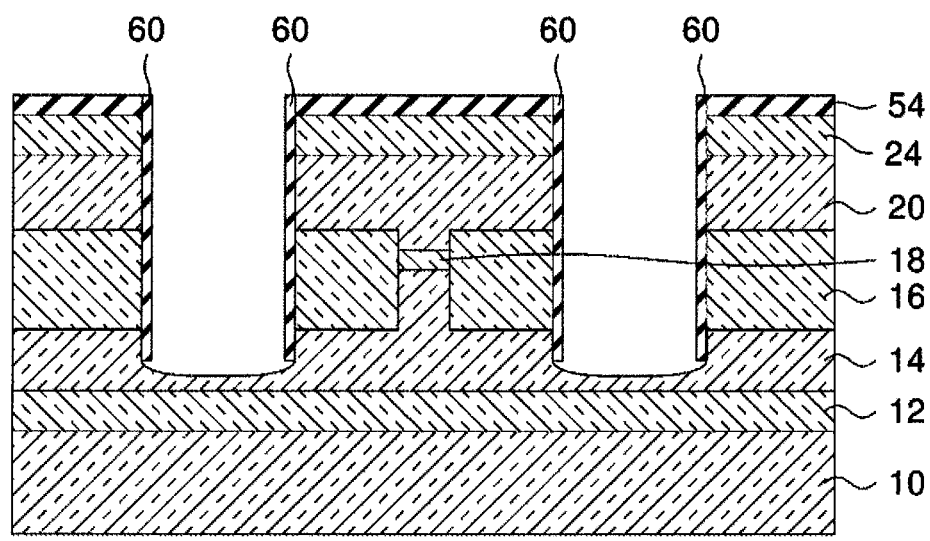
FIGS. 11A and 11B are cross-sectional views for explaining the method for manufacturing a semiconductor laser device according to the first embodiment.
Figure 11B:
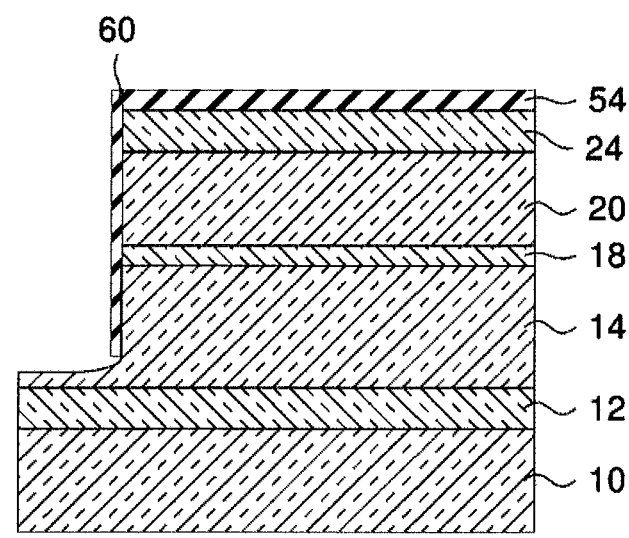

Next, as shown in FIGS. 11A and 11B, the entire surface of the mask 60 is etched back and the mask 60 not on the side faces of the groove 32a and the L shape 50a is removed. At this time, by adjusting the etch back time appropriately, it is possible to leave the mask 54 on the p-type contact layer 24. It is preferable to execute etching back under low-pressure conditions in order to prevent a reduction of the thickness of the SiO formed on the side faces of the groove 32a and the L shape 50a due to side etching, and, for example, the ICP-RIE method using a $CF_4/O_2$ mixed gas may be used.

Figure 12A:
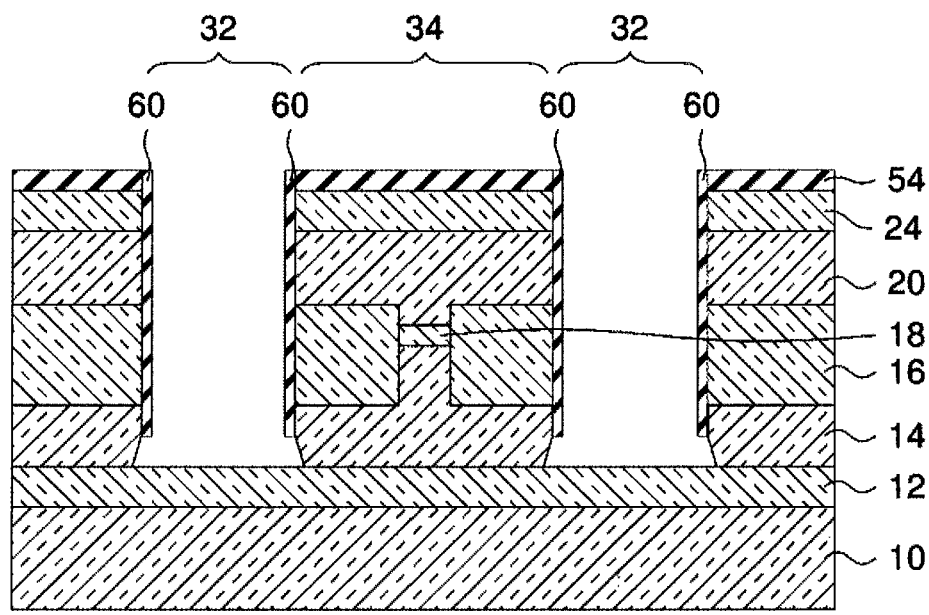
FIGS. 12A and 12B are cross-sectional views for explaining the method for manufacturing a semiconductor laser device according to the first embodiment.
Figure 12B:
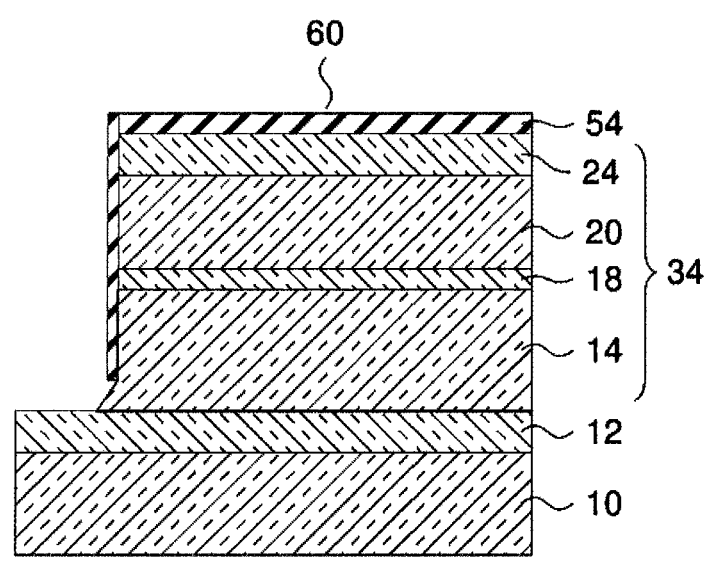
Figure 13A:
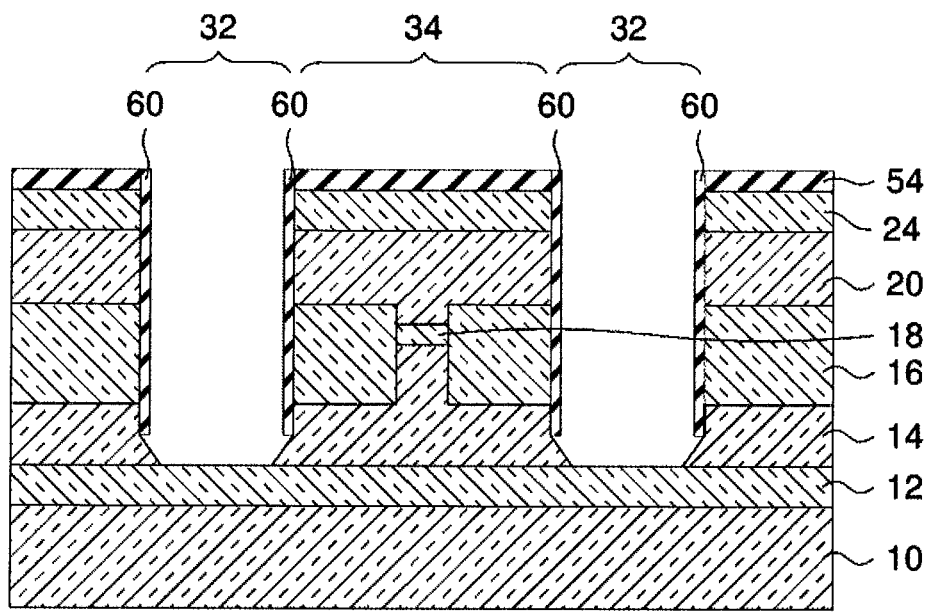
FIGS. 13A and 13B are cross-sectional views for explaining the method for manufacturing a semiconductor laser device according to the first embodiment.
Figure 13B:
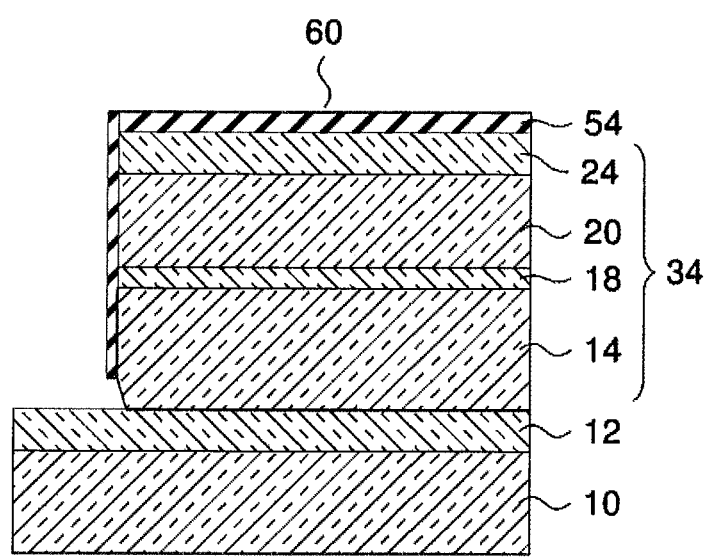

Next, as shown in FIGS. 12A and 12B, the bottom surfaces of the groove 32a and the L shape 50a are wet etched. More specifically, the n-type cladding layer 14 on the bottom surfaces of the groove 32a and the L shape 50a is soaked in an etchant having selectivity with respect to InGaAs, which is a material of the n-type contact layer, for example, a mixed solution of hydrochloric acid and phosphoric acid and etched. The mesa 34, the groove 32 and the L shape 50 are formed in this way. As illustrated in FIG. 3A, the slope 38 near the bottom surface 46 of the groove 32 has an inclination substantially perpendicular to the inverse mesa direction and the n-type contact layer 12 is exposed from the bottom surface 46. The slope 40 near the bottom surface 48 of the L shape has an inclination in the forward mesa direction and the n-type contact layer 12 is exposed from the bottom surface 48. The mask 60 formed on the side faces of the groove 32a and the L shape 50a protects the side faces to be etched from wet etching, and so the verticality of the side faces to be etched is maintained. Furthermore, since the groove 32 and the L shape 50 are simultaneously formed, heights of the respective bottom surface 46 and bottom surface 48 are equal. Note that a substance containing hydrogen bromide may be used as the etchant. Leaving the mask 54 is not essential in formation of the above-described mask 60. In the present embodiment, since InGaAs is adopted for the p-type contact layer 24, even when etching back is executed until the mask 54 is removed, the p-type contact layer 24 serves as an etching mask against wet etching, and can thereby prevent the semiconductor surface from being etched.

Furthermore, as shown in FIGS. 12A and 12B, although the n-type cladding layer 14 on the bottom surface 46 and the bottom surface 48 is assumed to be completely cut away in the wet etching step, part of it may be left.

The reason that inclinations in the inverse mesa direction and the forward mesa direction are produced is attributable to dependency of wet etching on crystal orientation. In the present embodiment, the mesa 34 is formed in the <011> direction and a mixed solution of hydrochloric acid and phosphoric acid is used as the etchant, and so the slope 38 of the mesa 34 becomes a substantially vertical inverse mesa and the slope 40 of the L shape 50 becomes a forward mesa. The orientation of the mesa 34 may be rotated by 90° (that is, formed in <01-1> direction), and in this case, the forward/inverse direction of the mesa is opposite to that in FIGS. 12A and 12B due to symmetry of InP crystal. Furthermore, a liquid containing hydrogen bromide, for example, a mixed solution of hydrogen bromide and $H_2O$ can be used for the etchant, and the angle of the forward/inverse mesa changes depending on etching conditions. Thus, the present disclosure does not limit the direction and angle of the mesa, but allows modifications according to the mesa direction and the etchant.

Figure 14A:
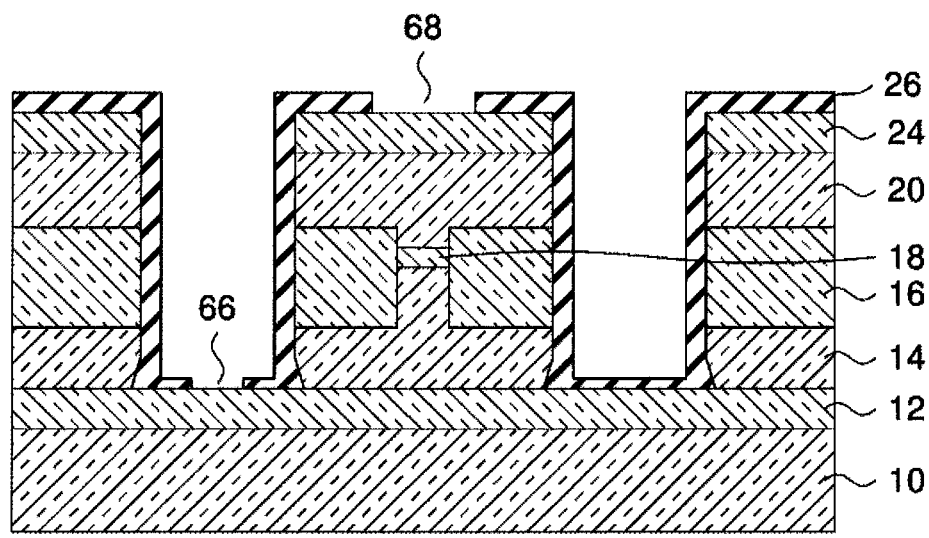
FIGS. 14A and 14B are cross-sectional views for explaining the method for manufacturing a semiconductor laser device according to the first embodiment.
Figure 14B:
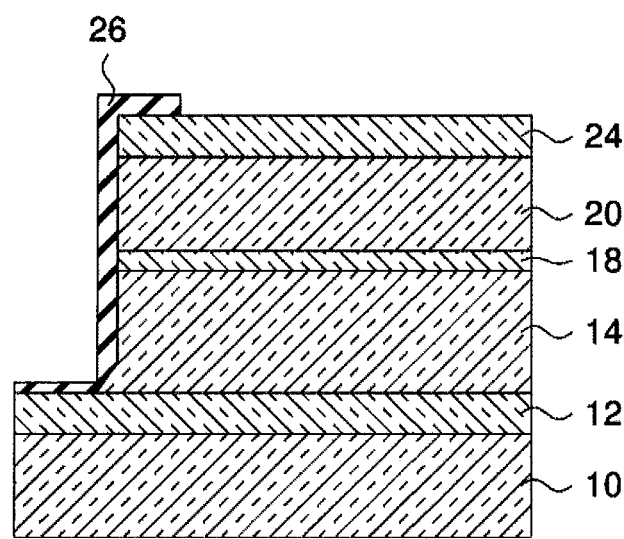

Next, as shown in FIGS. 14A and 14B, the insulating film 26 is formed. More specifically, the mask 54 and the mask 60 are removed by soaking them in BHF (buffered hydrofluoric acid) and a SiO (of any composition) film having a thickness of 0.4 μm is formed on the entire surface using, for example, a plasma CVD method. Furthermore, an opening 66 and an opening 68 are formed above the bottom surface 46 of the groove 32 and the mesa 34 respectively using photolithography and the RIE method. The opening 66 becomes a contact region with the n-side electrode 28 and the opening 68 becomes a contact region with the p-side electrode 30. The insulating film 26 defines a current injection region, functions as a protective film to protect the semiconductor surface from pollution, and further functions as part of a coating film for reflection factor control on the resonator end face. SiN, TiO, TaO or AlO (of any composition) or a film obtained by laminating these films in addition to SiO may be used for the insulating film 26 and a sputtering method or an ALD (Atomic Layer Deposition) method may be used as the film formation method.

Next, after forming a Ti/Au laminated film over the entire surface using the sputtering method, the n-side electrode 28 and the p-side electrode 30 are formed by photolithography and wet etching. After that, the reflection factor at the resonator end face may be adjusted by cleaving the substrate 10 into a bar state and forming a coat film on the side face of the L shape 50. The formation of the semiconductor laser device is thereby completed.

Note that although an example of application for a FP (Fabry-Perot) laser has been described above, this may also be used for a DFB laser. In this case, an InGaAsP diffraction grating structure having, for example, a thickness of 40 nm and having a periodic structure of 200 nm pitch in the resonator direction may be formed in the n-type cladding layer 14 or the p-type cladding layer 20. More specifically, an InGaAsP layer having a thickness of 40 nm may be formed during formation of the InP cladding layer, a SiO film having a thickness of 25 nm may be formed using the plasma CVD method, a diffraction grating pattern may be transcribed to the SiO film using an electron beam drawing method and the RIE method, the InGaAsP layer may be etched using the RIE method using a $CH_4/H_2$ mixed gas, and the cladding layer may be made to grow again to thereby embed the diffraction grating made of InGaAsP.

(Effects)

Effects of the semiconductor laser device and the manufacturing method therefor according to the first embodiment will be described.

Since this semiconductor laser device is of a surface mounting type, a parasitic capacitance caused by wiring and a capacitance between the electrodes are small. In the case of a non-surface mounting type, the two electrodes are located on the top surface and the undersurface of the device respectively, and so the capacitance between the electrodes increases. By contrast, in the case of a surface mounting type, both of the two electrodes are located on the front side of the device, and so a capacitance between the electrodes is small.

Moreover, since grooves are provided on both sides of the mesa, the device capacitance can be further reduced.

Since the resonator end face is formed by dry etching, position accuracy thereof is high. Superimposition accuracy at the position of the resonator end face formed in this way is on the submicron level, which is superimposition accuracy of photolithography, and it is possible to improve the superimposition accuracy considerably compared to variations on the several micron level using cleavage. A multi-wavelength integrated semiconductor laser device in particular integrates a plurality of DFB lasers having different wavelengths, but it is necessary to control phases of the diffraction gratings at the resonator end faces of DFB in view of improvement of the SMSR yield. For this reason, it is necessary not only to form a pattern so that phases of the diffraction gratings match at intended positions but also to form the resonator end face at the position accurately. Therefore, the present disclosure is also suitable for the multi-wavelength integrated semiconductor laser device.

Since the bottom end of the substantially vertical mesa side face including the resonator end face extends to the vicinity of the top surface of the n-type contact layer located away from the active layer, mirror loss is small. If this bottom end approaches the active layer, mirror loss caused by the slope below may increase, but the present semiconductor laser device can suppress such a problem.

Figure 15A:
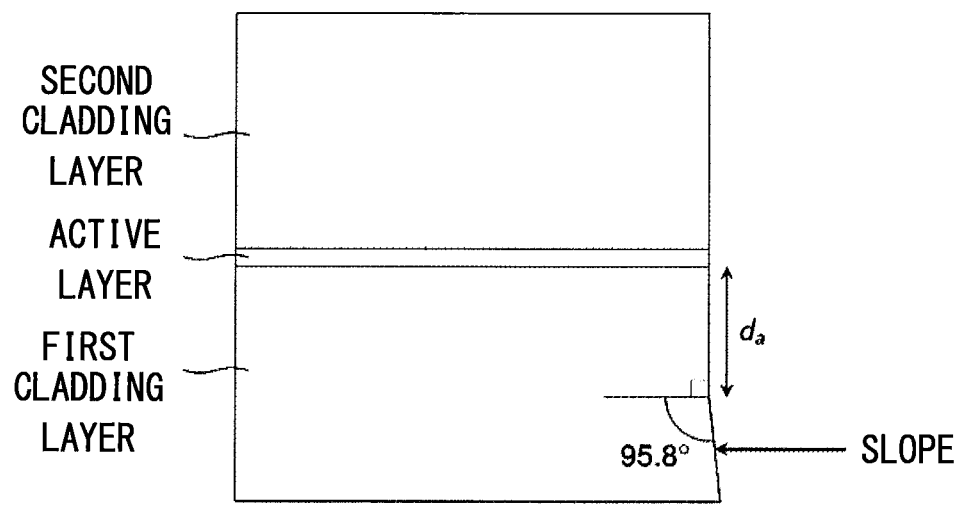
FIGS. 15A and 15B are cross-sectional views of the semiconductor laser device used in the verification experiment of the effect of the present disclosure.
Figure 15B:
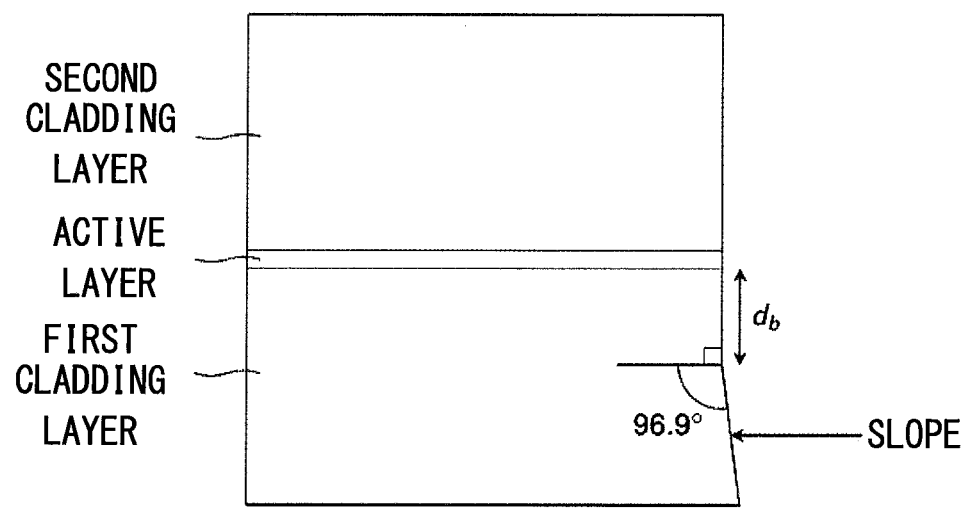
Figure 16:
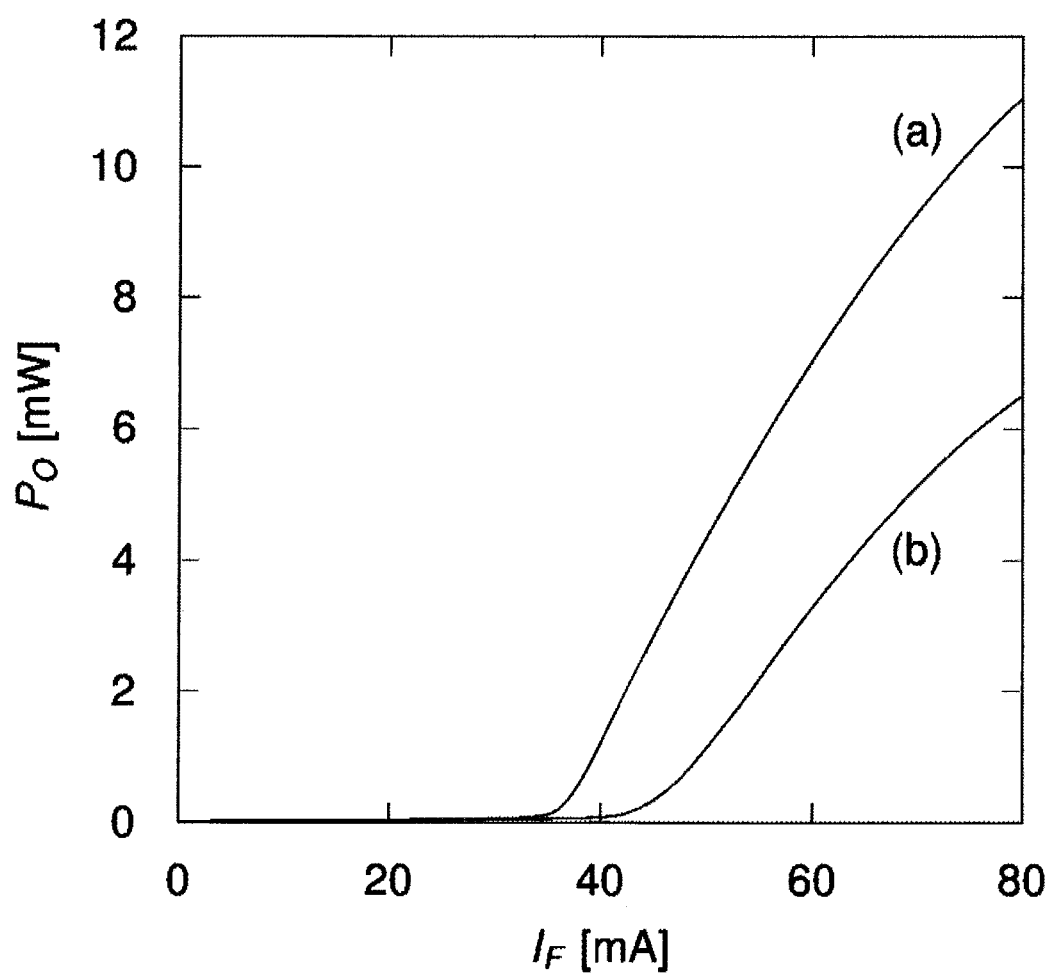
FIG. 16 illustrates the verification experiment result of the effect of the present disclosure.

Here, it will be proved from experiment results that the farther the top end of the slope is from the active layer, the better are the laser characteristics. Both FIGS. 15A and 15B are cross-sectional views of an FP laser used for the experiment. Reference character $d_a$ in FIG. 15A and $d_b$ in FIG. 15B denote distances from the bottom end of the active layer to the top end of the slope, and $d_a > d_b$ holds. FIG. 16 illustrates a measurement result indicating a current ($I_F$) dependency (P-I characteristics) with respect to optical output ($P_O$) of an FP laser, and (a) and (b) in the drawing correspond to FIGS. 15A and 15B respectively. As shown in FIG. 16, the FP laser in FIG. 15A has better P-I characteristics. This is based on the condition of $d_a > d_b$, indicating that the farther the slope is from the active layer, the smaller the mirror loss becomes.

To separate the top end of the slope from the active layer, dry etching may be executed for the longest possible time immediately before reaching the n-type cladding layer or the thickness of the n-type cladding layer may be increased.

The manufacturing method according to the first embodiment forms the resonator end face and the groove simultaneously, and can thereby form the semiconductor laser device in fewer steps.

It is also possible to expose the substrate-side contact layer without reducing its thickness according to selectivity of wet etching and thereby prevent the device resistance from increasing due to an decrease of the thickness of the contact layer. Therefore, it is only necessary to secure a minimum thickness with which desired device resistance is obtained in advance, which improves a throughput of the epitaxial growth apparatus.

Second Embodiment

A method for manufacturing a semiconductor laser device according to a second embodiment will be described. Here, steps similar to the steps in the manufacturing method according to the first embodiment will not be described in detail, but description will focus on differences from the first embodiment. Regarding the effects to be obtained, description will also focus on differences from the first embodiment.

(Manufacturing Method)

The manufacturing method according to the second embodiment is the same as in the first embodiment up to immediately before dry etching, that is, up to the state in FIGS. 8A and 8B. Hereinafter, the dry etching step where there are differences from the first embodiment will be described with reference to FIGS. 17A, 17B, 18A, and 18B. The drawings marked with A and B of these drawings denote cross-sectional views along A-A and B-B in FIG. 2, respectively.

After FIGS. 8A and 8B, when the groove and the L shape are formed by dry etching, the fact that the n-type contact layer is exposed by dry etching is detected from a change in plasma emission intensity and dry etching is stopped after the detection. When the n-type contact layer is exposed, plasma emission intensity of elements of the n-type contact layer or the n-type cladding layer changes, and so any one of the elements may be monitored. Here, since the n-type contact layer is InGaAs and the n-type cladding layer is InP, plasma emission intensity of any one of In, Ga, As and P may be monitored. Note that since layers including these elements are laminated above the n-type cladding layer, plasma emission intensity may change during etching of these layers. To avoid erroneous detection of this change, it may be possible to grasp the dry etching speed in advance, estimate the time required for etching to reach the n-type cladding layer and start monitoring after the time elapses.

Figure 17A:
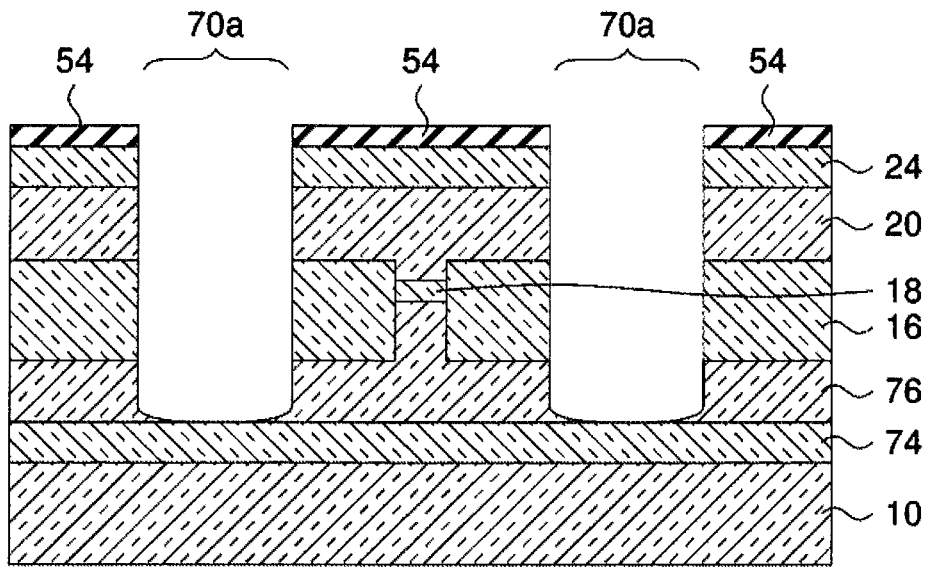
FIGS. 17A and 17B are cross-sectional views for explaining the method for manufacturing a semiconductor laser device according to the second embodiment.
Figure 17B:
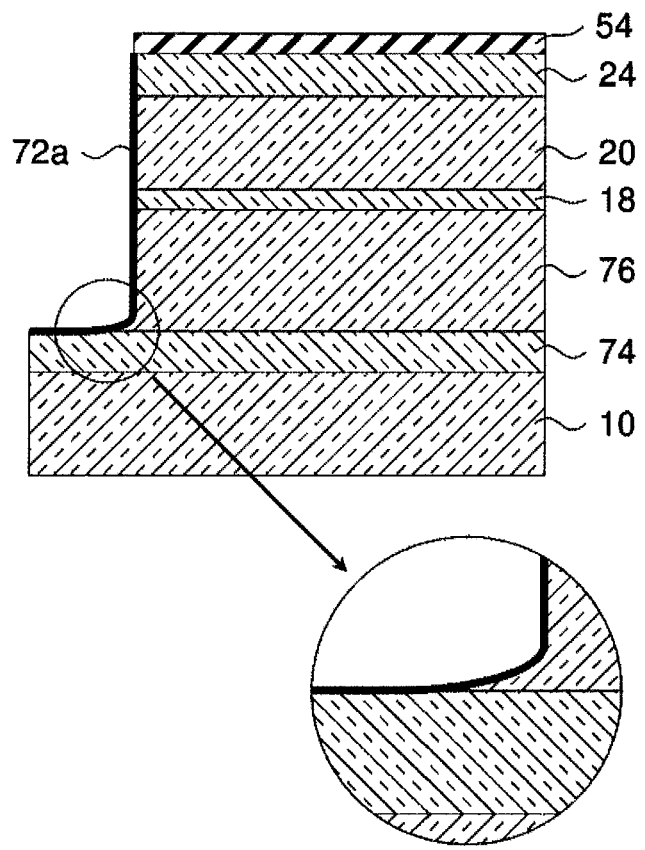
Figure 18A:
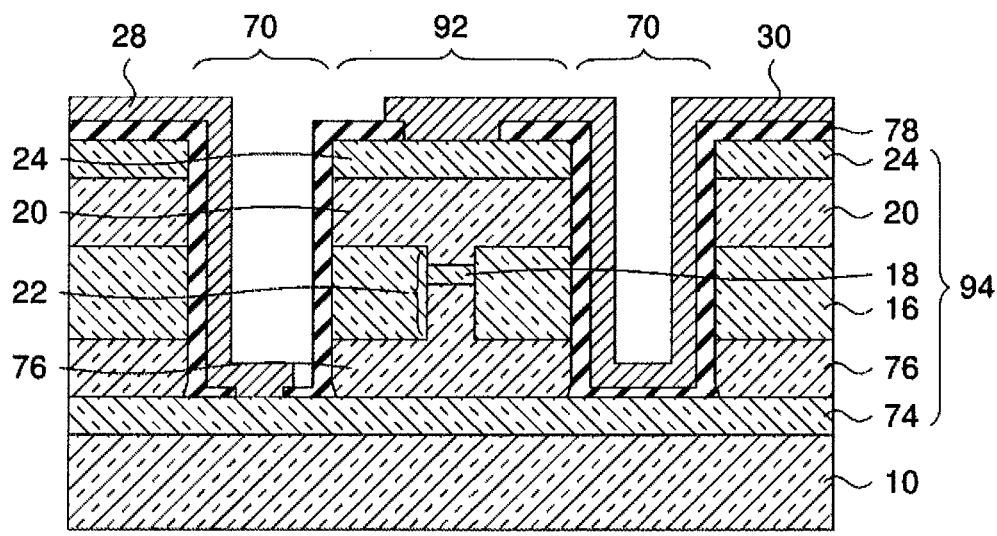
FIGS. 18A and 18B are cross-sectional views of the semiconductor laser device according to the second embodiment.
Figure 18B:
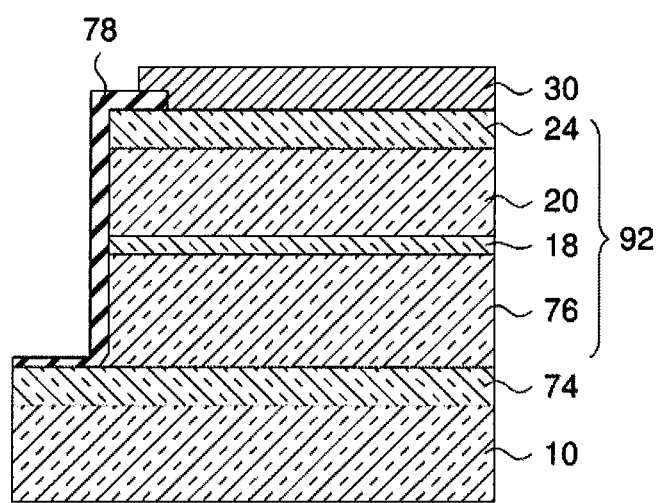
Figure 19A:
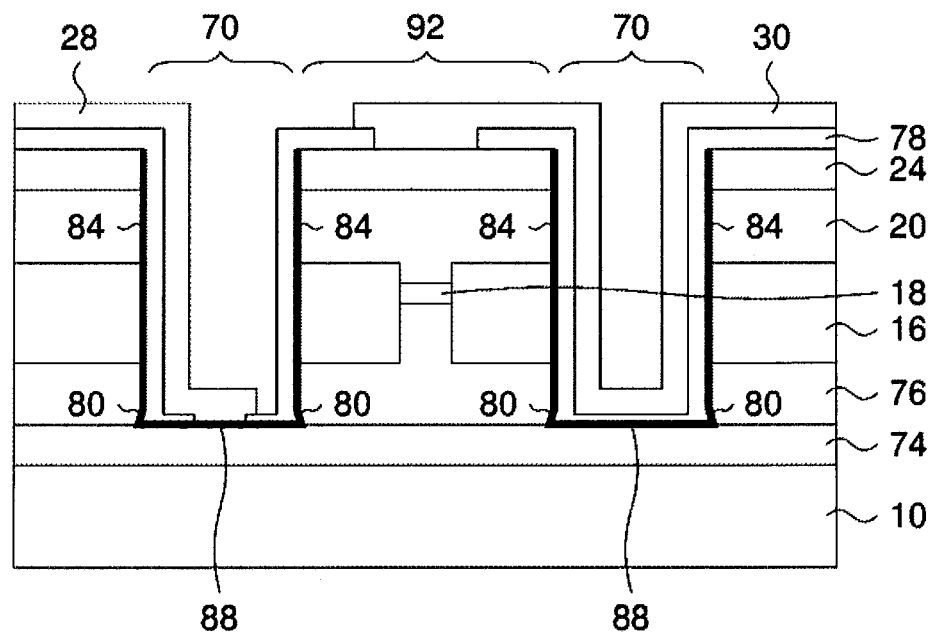
FIGS. 19A and 19B are cross-sectional views of the semiconductor laser device according to the second embodiment.
Figure 19B:
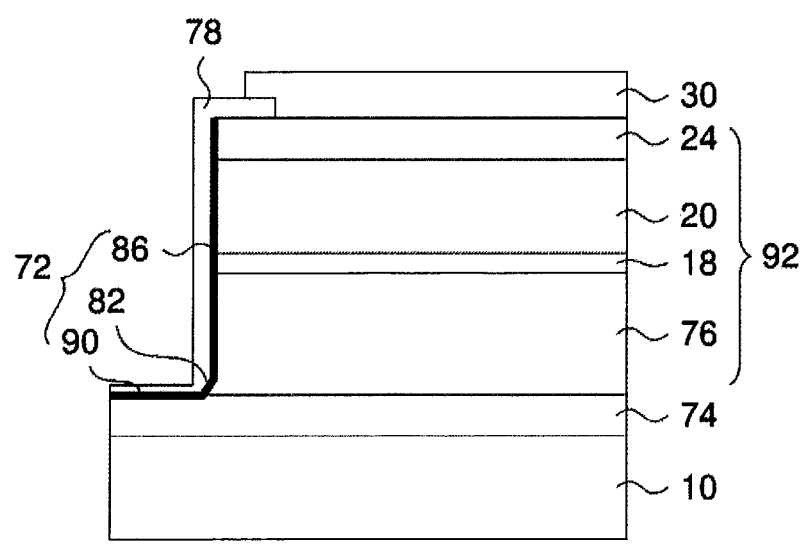

FIGS. 17A and 17B illustrate cross-sectional views after dry etching. FIG. 17B illustrates an enlarged view of the vicinity of the corner of an L shape 72a. It is clear from the drawings that a groove 70a formed by dry etching and the deepest part of the L shape 72a coincide with the top surface of the n-type contact layer 74. It is clear from the enlarged view in FIG. 17B that the side face of the L shape 72a substantially perpendicular to the substrate 10 extends to the vicinity of the bottom end of the n-type cladding layer 76. The bottom end of the substantially vertical side face is located maximally below under the condition that dry etching does not excessively cut away the n-type contact layer 74.

Next, a mask is formed over the entire surface including the side faces of the groove 70a and the L shape 72a. This step of mask formation is the same as the step described using FIGS. 10A and 10B in the first embodiment. The subsequent steps are also executed in the same way as in the first embodiment. The semiconductor laser device illustrated in FIGS. 18A, 18B, 19A, and 19B is formed in this way. It is FIGS. 1A, 1B, 3A, and 3B in the first embodiment that correspond to these drawings. It can be observed from a comparison between FIGS. 19A-19B and FIGS. 3A-3B that the bottom ends of the side face 84 and the side face 86 extend downward more in the semiconductor laser device manufactured using the manufacturing method of the second embodiment.

(Effects)

Using the manufacturing method for the semiconductor laser device according to the second embodiment prevents an increase in the device resistance. This manufacturing method detects during dry etching that the n-type contact layer 74 is exposed, and can prevent an increase in the device resistance without excessively cutting away the n-type contact layer 74.

Moreover, mirror loss by the slope can be suppressed. This manufacturing method executes dry etching up to an extreme that the n-type contact layer 74 is exposed, and so the side face 86 of the L shape 72 extends downward to a maximum degree. It is thereby possible to reduce mirror loss caused by the slope 82 below the side face 86.

(Modification)

As a modification of the second embodiment, after confirming that dry etching has reached the top surface of the n-type contact layer 74, it is also possible to stop dry etching after a certain time elapses. The n-type contact layer 74 is cut away, but since the bottom end of the side face 86 can be extended further downward by adjusting the above-described time, mirror loss can be further reduced.

REFERENCE SIGNS LIST 10 substrate
12,74 n-type contact layer
14,76 n-type cladding layer
16 block layer
18 active layer
20 p-type cladding layer
22 ridge
24 p-type contact layer
26,78 insulating film
28 n-side electrode
30 p-side electrode
32,32a,70,70a groove
34,92 mesa
36,94 semiconductor layer
38,40,80,82 slope
42,44,84,86 side face
46,48,88,90 bottom surface
50,50a,72,72a L shape
52,54,60 mask
56,58,66,68 opening

The invention claimed is:

1. A semiconductor laser device comprising:
a substrate; and
a semiconductor layer provided on the substrate and including a first conductivity type contact layer,
wherein a mesa is provided in the semiconductor layer and includes a resonator and a second conductivity type contact layer,
grooves are provided on opposing sides of the mesa,
a top surface of the first conductivity type contact layer and a side face of the mesa including at least one end face of the resonator construct an L shape,
the top surface of the first conductivity type contact layer constructs a bottom surface of the L shape,
for each of the grooves, a side face of the groove includes a first slope near the bottom surface of the groove and a first side face above the first slope, the first side face being substantially perpendicular to the bottom surface of the groove,
a side face of the L shape includes a second slope near the bottom surface of the L shape and a second side face above the second slope, the second side face being substantially perpendicular to the bottom surface of the L shape,
a first electrode is connected to the first conductivity type contact layer and the first electrode is positioned directly on the bottom surface of at least one of the grooves,
a second electrode is connected to the second conductivity type contact layer,
the first conductivity type contact layer forms the bottom surfaces of the grooves,
the first side face and the second side face being formed by dry etching until a portion of the first conductivity type contact layer is exposed, and
the first slope and the second slope being formed by wet etching after the dry etching.

2. The semiconductor laser device according to claim 1, wherein the resonator includes a first conductivity type cladding layer, an active layer, a second conductivity type cladding layer which are laminated sequentially from a bottom, and
a diffraction grating structure is provided in the first conductivity type cladding layer or the second conductivity type cladding layer.

3. The semiconductor laser device according to claim 2, wherein the substrate is made of semi-insulating InP,
the first conductivity type contact layer is made of n-type InGaAs or n-type InGaAsP, and
the first conductivity type cladding layer is made of n-type InP.

4. A method for manufacturing a semiconductor laser device which includes a mesa having a resonator, comprising:
sequentially forming a first conductivity type contact layer, a first conductivity type cladding layer, an active layer, a second conductivity type cladding layer, and a second conductivity type contact layer on a substrate;
performing dry etching until a portion of the first conductivity type contact layer is exposed and leaving a part of the first conductivity type cladding layer directly above the first conductivity type contact layer to form grooves on both sides of the mesa and an L shape including a side face of the mesa having an end face of the resonator;
masking an etching side face formed by the dry etching and using an etchant having selectivity with respect to the first conductivity type contact layer to wet etch the first conductivity type cladding layer on bottom surfaces of the grooves and the L shape;
forming a first electrode connected to the first conductivity type contact layer at the bottom surface of at least one of the grooves, and
forming a second electrode connected to the second conductivity type contact layer.

5. The method for manufacturing a semiconductor laser device according to claim 4, comprising:
monitoring plasma emission intensity of an element of the first conductivity type contact layer or the first conductivity type cladding layer which changes when the first conductivity type contact layer is exposed by the dry etching; and stopping the dry etching at a point when change of the plasma emission intensity is detected or after a certain time elapses from the point.

6. The method for manufacturing a semiconductor laser device according to claim 5, comprising forming a diffraction grating structure in the first conductivity type cladding layer or the second conductivity type cladding layer.

7. The method for manufacturing a semiconductor laser device according to claim 6, wherein the substrate is made of semi-insulating InP, the first conductivity type contact layer is made of n-type InGaAs or n-type InGaAsP, and the first conductivity type cladding layer is made of n-type InP.

8. The method for manufacturing a semiconductor laser device according to claim 5, wherein the substrate is made of semi-insulating InP, the first conductivity type contact layer is made of n-type InGaAs or n-type InGaAsP, and the first conductivity type cladding layer is made of n-type InP.

9. The method for manufacturing a semiconductor laser device according to claim 4, comprising forming a diffraction grating structure in the first conductivity type cladding layer or the second conductivity type cladding layer.

10. The method for manufacturing a semiconductor laser device according to claim 9, wherein the substrate is made of semi-insulating InP, the first conductivity type contact layer is made of n-type InGaAs or n-type InGaAsP, and the first conductivity type cladding layer is made of n-type InP.

11. The method for manufacturing a semiconductor laser device according to claim 4, wherein the substrate is made of semi-insulating InP, the first conductivity type contact layer is made of n-type InGaAs or n-type InGaAsP, and the first conductivity type cladding layer is made of n-type InP.

12. The method for manufacturing a semiconductor laser device according to claim 11, wherein hydrochloric acid or hydrogen bromide is used as the etchant.

13. The method for manufacturing a semiconductor laser device according to claim 4, wherein the first conductivity type contact layer forms the bottom surfaces of the grooves, and the first electrode is positioned directly on the bottom surface of the at least one of the grooves.

* * * * *